US012025669B2

(12) United States Patent
Miars

(10) Patent No.: US 12,025,669 B2
(45) Date of Patent: Jul. 2, 2024

(54) SPACECRAFT ELECTRIC POTENTIAL MONITORING

(71) Applicant: The Regents of the University of Michigan, Ann Arbor, MI (US)

(72) Inventor: Grant Camden Miars, Ann Arbor, MI (US)

(73) Assignee: The Regents of the University of Michigan, Ann Arbor, MI (US)

(*) Notice: Subject to any disclaimer, the term of this patent is extended or adjusted under 35 U.S.C. 154(b) by 388 days.

(21) Appl. No.: 17/208,164

(22) Filed: Mar. 22, 2021

(65) Prior Publication Data

US 2022/0011371 A1    Jan. 13, 2022

Related U.S. Application Data

(60) Provisional application No. 62/992,356, filed on Mar. 20, 2020.

(51) Int. Cl.
*G01R 31/382* (2019.01)
*B64G 1/66* (2006.01)
(Continued)

(52) U.S. Cl.
CPC .......... *G01R 31/382* (2019.01); *B64G 1/66* (2013.01); *H02J 7/0047* (2013.01); *H02J 7/14* (2013.01)

(58) Field of Classification Search
CPC ........ G01R 31/382; H02J 7/0047; H02J 7/14; B64G 1/66
(Continued)

(56) References Cited

U.S. PATENT DOCUMENTS 4,101,825 A * 7/1978 Truax .................. G01R 29/12
324/458
11,340,279 B1 * 5/2022 Fitzgerald ............. G08B 21/02
(Continued)

FOREIGN PATENT DOCUMENTS

CN    103760887 A  *  4/2014
CN    104316569 A  *  1/2015
(Continued)

OTHER PUBLICATIONS

Krause et al., "Survey of DSCS-III B-7 Differential Surface Charging", IEEE Transactions on Nuclear Science, Dec. 2004, pp. 3399-3407, vol. 51, No. 6.
(Continued)

*Primary Examiner* — Suresh Memula
(74) *Attorney, Agent, or Firm* — Lempia Summerfield Katz LLC

(57) ABSTRACT

A device for monitoring spacecraft electric potential includes a first conductor configured to be in electrical communication with a conductive structure of a spacecraft, a second conductor capacitively coupled to the first conductor, a switch connected to the first conductor and the second conductor such that closure of the switch electrically ties the first conductor to the second conductor, and a monitoring circuit in electrical communication with the second conductor, the monitoring circuit being configured to detect an electric potential of the second conductor relative to the first conductor, the detected electric potential being indicative of a change in electric potential of the first conductor relative to the second conductor since an opening of the switch.

21 Claims, 3 Drawing Sheets

(51) Int. Cl.
*H02J 7/00* (2006.01)
*H02J 7/14* (2006.01)

(58) Field of Classification Search
USPC .......................................................... 320/132
See application file for complete search history.

(56) References Cited

U.S. PATENT DOCUMENTS

| | | | | |
|---|---|---|---|---|
| 2008/0203975 | A1* | 8/2008 | Burlak | H02H 3/12 320/161 |
| 2015/0344156 | A1* | 12/2015 | Vail, III | G01R 31/008 701/32.8 |
| 2021/0159689 | A1* | 5/2021 | Faxvog | H02H 5/005 |
| 2022/0239137 | A1* | 7/2022 | Chen | B60R 16/033 |
| 2023/0134808 | A1* | 5/2023 | Wiegman | B60L 3/04 320/109 |
| 2023/0135249 | A1* | 5/2023 | Wiegman | B64F 1/362 320/109 |
| 2023/0168315 | A1* | 6/2023 | Furukawa | G01R 31/52 702/58 |
| 2023/0219422 | A1* | 7/2023 | Wagner | H01M 10/48 701/29.4 |
| 2023/0348053 | A1* | 11/2023 | Clark | B60L 50/61 |

FOREIGN PATENT DOCUMENTS

| | | | | |
|---|---|---|---|---|
| WO | WO-0192897 | A2 * | 12/2001 | ............... B64G 1/54 |
| WO | WO-2021117681 | A1 * | 6/2021 | ............. B64D 45/02 |

OTHER PUBLICATIONS

Minow et al., "Techniques for Measuring Surface Potentionals in Space", NASA, Measurement Techniques in Solar and Space Physics Conference Boulder, Colorado, Apr. 20-24, 2015, 17 pages.

P.F. Mizera, "Charging Results from the Satellite Surface Potential Monitor", J. Spacecraft, Nov. 1981, pp. 506-509, vol. 18, No. 6.

Ryden et al., "A Compact Electrostatic Charging Monitor for Spacecraft", Fifth European Conference on Radiation and Its Effects on Components and Systems, 1999, 3 pages.

Shu T. Lai, "A Critical Overview of Measurement Techniques of Spacecraft Charging in Space Plasma", Spacecraft Charging Measurement Techniques, 1998, pp. 217-221.

Shu T. Lai, "A Critical Overview on Spacecraft Charging Mitigation Methods", IEEE Transactions on Plasma Science, Dec. 2003, pp. 1118-1124, vol. 31, No. 6.

* cited by examiner

SPACECRAFT ELECTRIC POTENTIAL MONITORING

CROSS-REFERENCE TO RELATED APPLICATION

This application claims the benefit of U.S. provisional application entitled "Spacecraft Electric Potential Monitoring," filed Mar. 20, 2020, and assigned Ser. No. 62/992,356, the entire disclosure of which is hereby expressly incorporated by reference.

BACKGROUND OF THE DISCLOSURE

Field of the Disclosure

The disclosure relates generally to spacecraft electrostatic charging measurement.

Brief Description of Related Technology

Spacecraft electrostatic charging has been monitored for multiple reasons. For example, spacecraft charging is useful in connection with spacecraft configured for charged particle beam emission. The extent of spacecraft charging may then be used for beam detection troubleshooting. Other reasons for charge monitoring in such spacecraft include system safety efforts, and charged particle emission validation.

Spacecraft charge monitoring may also useful in other contexts, including, for instance, the impact of space weather. Electrostatic discharges can be triggered by a geomagnetic storm. Charge monitoring has been used to detect charging induced by dangerous space weather events, such as solar storms. Sensitive equipment onboard the spacecraft may be selectively deactivated and protected in response to the charge monitoring information.

Spacecraft charge monitoring is also useful in connection with hostile threats from third parties. Satellites and other spacecraft may be destroyed or degraded using non-kinetic systems, including, for instance, directed energy weapons, such as high power microwaves and lasers, and charged particle beams. Charging may also be induced by electromagnetic pulses arising from nuclear detonation. Exo-atmosphere nuclear explosions may also increase charged-particle radiation to levels that cause damage. In such scenarios, sensitive equipment is deactivated and protected using the charge monitoring information.

Existing charge monitoring devices attempt to measure the electric potential of the spacecraft relative to the surrounding plasma. Examples include charged particle detectors, such as retarding potential analyzers (RPAs), electrostatic analyzers (ESAs), and Langmuir probes, electric field sensors, and wave detectors. But such techniques for measuring absolute potential have often been undesirably slow (e.g., a few seconds per measurement), prohibitively expensive, and/or involve data downlinking for analysis and other processing.

SUMMARY OF THE DISCLOSURE

In accordance with one aspect of the disclosure, a device for monitoring spacecraft electric potential includes a first conductor configured to be in electrical communication with a conductive structure of a spacecraft, a second conductor capacitively coupled to the first conductor, a switch connected to the first conductor and the second conductor such that closure of the switch electrically ties the first conductor to the second conductor, and a monitoring circuit in electrical communication with the second conductor. The monitoring circuit is configured to detect an electric potential of the second conductor relative to the first conductor. The detected electric potential is indicative of a change in electric potential of the first conductor relative to the second conductor since an opening of the switch.

In accordance with another aspect of the disclosure, a spacecraft includes a frame, a monitoring probe supported by the frame, the monitoring probe being configured to monitor an electric potential of the frame, and a controller in communication with the monitoring probe. The monitoring probe includes a first conductor in electrical communication with the frame, a second conductor capacitively coupled to the first conductor, a switch connected to the first conductor and the second conductor such that closure of the switch electrically ties the first conductor to the second conductor, and a monitoring circuit in electrical communication with the second conductor, the monitoring circuit being configured to detect an electric potential of the second conductor relative to the first conductor. The controller is configured to generate, based on the detected electric potential, an indication of a change in electric potential of the first conductor since an opening of the switch.

In accordance with yet another aspect of the disclosure, a method of monitoring spacecraft electric potential includes sending, by a processor, a control signal to a switch to open the switch, the switch being connected to a first conductor and a second conductor, the first conductor being in electrical communication with a spacecraft frame, the second conductor being capacitively coupled to the first conductor, obtaining, by the processor, an indication of an electric potential of the second conductor relative to the first conductor, the indication being provided via a monitoring circuit in electrical communication with the second conductor, generating, by the processor, based on the obtained indication, data indicative of a change in electric potential of the first conductor since an opening of the switch, and sending, by the processor, a further control signal, to close the switch to electrically tie the first conductor and the second conductor in preparation for further monitoring of the electric potential of the second conductor.

In accordance with still another aspect of the disclosure, a device for monitoring an electric potential of an ungrounded system includes a first conductor configured to be in electrical communication with a conductive structure of the ungrounded system, a second conductor capacitively coupled to the first conductor, a switch connected to the first conductor and the second conductor such that closure of the switch electrically ties the first conductor to the second conductor, and a monitoring circuit in electrical communication with the second conductor. The monitoring circuit is configured to detect an electric potential of the second conductor relative to the first conductor. The detected electric potential is indicative of a change in electric potential of the first conductor relative to the second conductor since an opening of the switch.

In connection with any one of the aforementioned aspects, the devices, spacecraft, and/or methods described herein may alternatively or additionally include or involve any combination of one or more of the following aspects or features. The conductive structure includes a frame of the spacecraft. The first conductor is configured to be electrically tied to the frame. The first conductor is electrically tied to spacecraft common potential such that the electric potential detected by the monitoring circuit is relative to the spacecraft common potential. The monitoring circuit is connected between the first conductor and the second conductor. The monitoring circuit is configured such that the first conductor provides a reference voltage to the monitoring circuit. The device further includes a controller coupled to the monitoring circuit, the controller being configured to store the indication of the change in the electric potential for combination with a further indication of the change in the electric potential to generate, based on the detected electric potential, a composite change in electric potential of the first conductor over multiple charging periods between successive instances of the opening of the switch. The controller is further configured to generate a control signal for the switch. The monitoring circuit presents a blocking impedance to isolate the second conductor from the first conductor while the switch remains open. The blocking impedance includes an isolating resistor disposed between the first and second conductors. The monitoring circuit includes an isolation amplifier. The monitoring circuit includes an electric field sensor. The device further includes an analog-to-digital circuit coupled to the monitoring circuit to generate a digital signal representative of the detected electric potential. The frame defines an interior of the spacecraft. The monitoring probe is disposed within the interior of the spacecraft. The monitoring probe is mounted on the frame. The first conductor is electrically tied to the frame such that the first conductor is electrically tied to spacecraft common potential, and such that the electric potential detected by the monitoring circuit is relative to the spacecraft common potential. The controller is further configured to store the indication of the change in the electric potential for combination with a further indication of the change in the electric potential to generate, based on the detected electric potential, a composite change in electric potential of the first conductor over multiple charging periods between successive instances of the opening of the switch. The controller is further configured to generate a control signal for the switch. The spacecraft further includes an electron beam generator. Operation of the electron beam generator changes the electric potential of the first conductor. The indication is provided to the electron beam generator. The electron beam generator is configured to shut down in response to the indication. Generating the data indicative of the change in electric potential includes inverting the obtained indication of the electric potential.

BRIEF DESCRIPTION OF THE DRAWING FIGURES

For a more complete understanding of the disclosure, reference should be made to the following detailed description and accompanying drawing figures, in which like reference numerals identify like elements in the figures.

Figure 1:
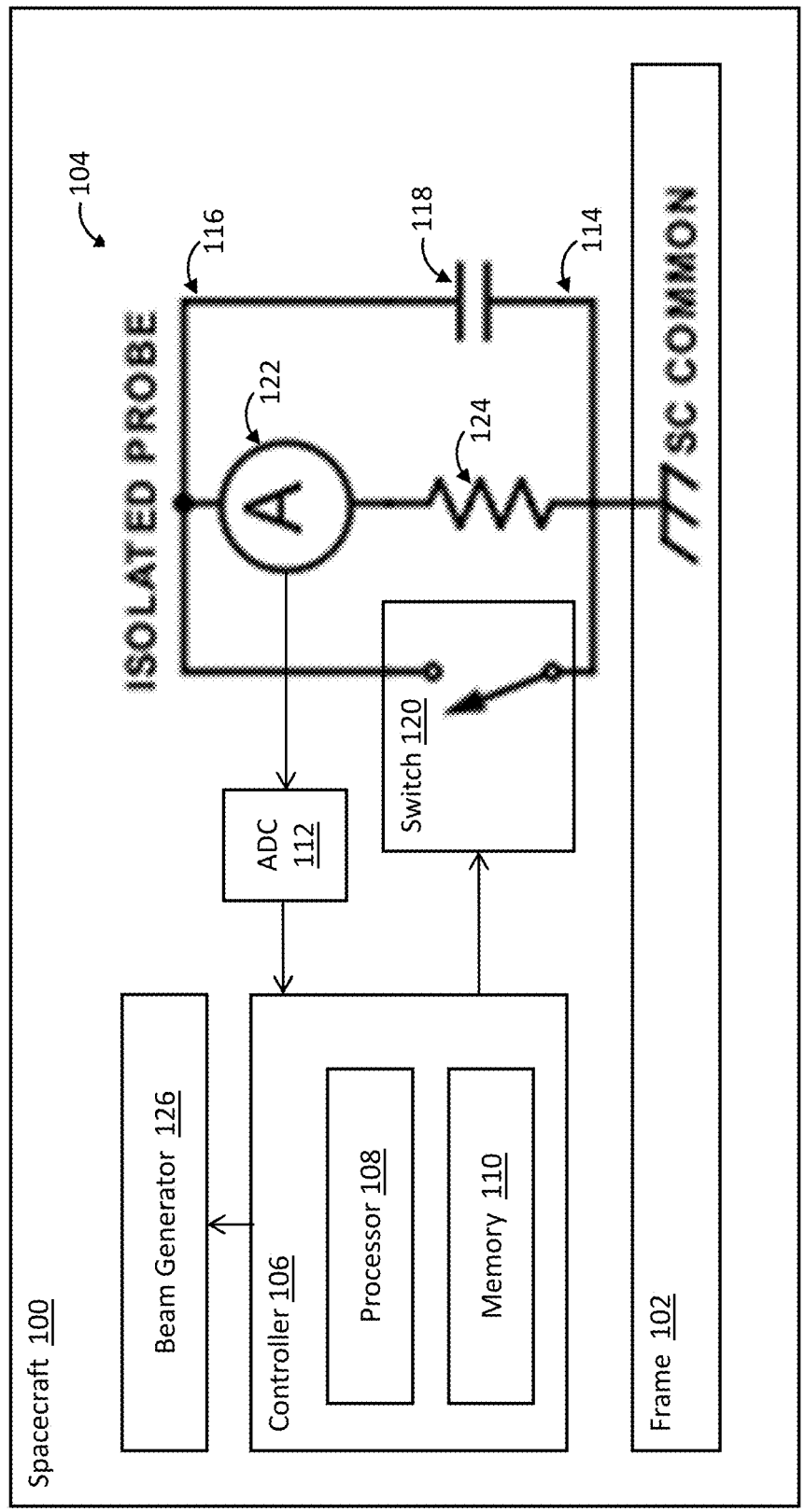
FIG. 1 is a schematic diagram of a spacecraft having a device for monitoring spacecraft electric potential, or electrostatic charging, in accordance with one example.

The embodiments of the disclosed devices, spacecraft, and methods may assume various forms. Specific embodiments are illustrated in the drawing and hereafter described with the understanding that the disclosure is intended to be illustrative. The disclosure is not intended to limit the invention to the specific embodiments described and illustrated herein.

DETAILED DESCRIPTION OF THE DISCLOSURE

Devices and methods for monitoring spacecraft electric potential, or electrostatic charging, are described. The disclosed methods and devices use a monitoring probe or other conductor to monitor the electric potential of the spacecraft, i.e., another conductor on the spacecraft. The other conductor may be in electrical communication with (e.g., electrically tied to) a frame of the spacecraft and may accordingly be referred to herein as the "spacecraft common conductor" or "common conductor." The monitoring probe is selectively allowed to float (e.g., via electric isolation) relative to the spacecraft common conductor by opening a switch of the disclosed devices. The devices and methods may then detect the electric potential of the monitoring probe to determine a change in the electric potential of the spacecraft common conductor since the switch was opened.

The use of a switch to control the monitoring of spacecraft electric potential allows for rapid measurement. Rapid changes in electric potential may thus be detected. The disclosed devices and methods are thus capable of detecting harmful or otherwise important changes to the spacecraft electric potential in a timely manner. The disclosed devices and methods are capable of much faster spacecraft potential measurements than previous techniques and with a lower cost of deployment. Moreover, a monitoring or measurement probe of the disclosed devices is easier to integrate on a spacecraft. For instance, the monitoring probe may be mounted or otherwise disposed within a spacecraft body or interior, e.g., on a small circuit board. Complex deployment on a boom or other exterior location of the spacecraft may thus be avoided.

The disclosed devices and methods monitor the spacecraft electric potential by measuring changes to the spacecraft potential. The change in potential is relative to a previous potential measurement. As described herein, such successive measurement of the potential may be considered, or involve, storing data indicative of a previous spacecraft potential measurement, and comparing or otherwise combining the previous potential with a current potential measurement.

The disclosed devices and methods measure or monitor the spacecraft potential by disconnecting a conductor. The conductor is thereby isolated from spacecraft common (or spacecraft potential). The conductor may accordingly be referred to herein as "the isolated conductor" or "the probe conductor." The disconnection of the probe conductor is achieved using an electrical, electromechanical, mechanical, or other switch. The probe conductor thus remains at the spacecraft potential as of the time of disconnection. At a subsequent time, the potential of the common spacecraft potential is measured relative to the probe conductor. This measurement may use various techniques, e.g., voltage measurement techniques, including, for instance, a high-impedance isolation amplifier, a tuning fork, or another electric field sensor. The potential measurement may be compared or otherwise combined with a previous potential measurement stored by the device. The probe conductor may be reset for a further measurement (e.g., for accuracy, ease of use, and/or other reasons) by reconnecting the probe conductor to spacecraft common via closure of the switch.

The probe conductor of the disclosed devices and methods provides an isolated reference of what the spacecraft potential was when the switch was closed. This previous potential may correspond with a potential before the occurrence of an event, such as a charged particle emission beam firing. By measuring the subsequent electric potential of the spacecraft common relative to the previous potential, the charging (or change in potential) induced by the beam firing (or other event) may be measured or monitored. In other words, by measuring the difference between this past spacecraft potential and the current potential, the charging induced by the beam may be tracked. The difference may be measured, or determined, as a potential measurement of the current spacecraft common conductor relative to the previous spacecraft common or, as described herein, the measurement of previous spacecraft common relative to the current spacecraft common. The inverse of that measurement may then provide the change in electric potential of the spacecraft common since the switch was opened.

The switch-based approach of the disclosed methods and systems allows high cadence monitoring to be provided. The switch and other components of the disclosed devices are also relatively inexpensive to deploy both in terms of component cost as well as system integration complexity. For instance, the disclosed devices may be disposed within the spacecraft interior rather than involving an excessively large boom. In other cases, the disclosed devices may be disposed on the exterior of the spacecraft.

Although described in connection with the monitoring of electric potential of a spacecraft (e.g., a conductive frame of the spacecraft), the disclosed methods and devices may be applied to a wide variety of contexts involving, for instance, an ungrounded structure. The configuration and other characteristics of the structure, and any electric system or device thereof or otherwise associated therewith, may thus vary. In one example, the disclosed methods and devices may use an ungrounded structure to track or otherwise measure the ambient (e.g., local) electric field in the region of space traversed by a spacecraft. In another example, the disclosed methods and devices may use an ungrounded structure to monitor or otherwise measure the impact of dust and other space debris on a spacecraft. References herein to embodiments involving a spacecraft may accordingly be modified to replace the spacecraft with another vehicle or other ungrounded structure or other system.

FIG. 1 depicts a spacecraft 100 or other ungrounded vehicle or structure in accordance with one example. The spacecraft 100 includes a frame 102 or other conductive structure. The frame 102 is subject to electrostatic charging, e.g., during operation, for various reasons. For example, the electrostatic charging may occur as a result of electron or ion beam emission or other operations, as a result of interaction with the plasma environment in which the spacecraft 100 is disposed, and/or as a result of events to which the spacecraft 100 is subjected.

The electrostatic charging is exhibited by an increase or decrease in the electric potential of the frame 102. The frame 102 may be composed of, or otherwise include, a conductive material, such as a conductive metal. In the example of FIG. 1, the frame 102 acts as an electric common (or common node) for the spacecraft 100. Structurally, the frame 102 may define an interior or body of the spacecraft 100. The construction, composition, configuration and other characteristics of the frame 102 may vary considerably.

The spacecraft 100 includes a monitoring probe 104 or other device supported by the frame 102. The monitoring probe 104 is configured to monitor the electric potential, or electrostatic charging, of the spacecraft 100. The monitoring probe 104 may monitor the electric potential of the spacecraft common. In this example, the monitoring probe 104 is configured to monitor an electric potential of the frame 102.

In the example of FIG. 1, the monitoring probe 104 is disposed within the interior of the spacecraft 100. In some cases, the monitoring probe 104 is mounted (e.g., directly mounted) on the frame 102. The monitoring probe 104 may be disposed on the exterior of the spacecraft in other cases.

The spacecraft 100 includes a controller 106 coupled to, or in communication with, the monitoring probe 104. The controller 106 may include a processor 108 and a memory 110. The memory 110 may have one or more sets of instructions stored thereon for execution by the processor 108. The memory 110 may alternatively or additionally be used to store data generated via the monitoring probe 104. The processor 108 may include any number of processing cores or other units. The memory 110 may include any number of storage or memory units or devices. The processor 108 and the memory 110 may be integrated to any desired extent. In some cases, the controller 106 is or includes a microcontroller or other microprocessor dedicated to controlling and otherwise interacting with the monitoring probe 104. For example, the controller 106 may include an application-specific integrated circuit (ASIC), field programmable gate array (FPGA), or other application-specific processing unit or system. Alternatively, the controller 106 is configured to control one or more other functions or operations of the spacecraft 100. The configuration and other characteristics of the controller 106 may vary considerably from the example shown. In any case, the controller 106 may be considered to be an element of the monitoring probe or device 104.

In the example of FIG. 1, the spacecraft 100 includes an analog-to-digital converter (ADC) 112 between the monitoring probe 104 and the controller 106. The ADC 112 is configured to convert an analog output signal from the monitoring probe 104 into a digital input signal for the controller 106. In other cases, the ADC 112 may be integrated with the controller 106 or the monitoring probe 104 to any desired extent.

The monitoring probe 104 includes a first, or spacecraft common, conductor 114 in electrical communication with spacecraft common. In this example, the spacecraft common conductor 114 is in electrical communication with the frame 102. The spacecraft common conductor 114 may be electrically tied to the frame 102 such that the spacecraft common conductor 114 is electrically tied to spacecraft common potential. The electric potential detected by the monitoring probe 104 may thus be relative to the spacecraft common potential, as described herein.

The spacecraft common conductor 114 may include one or more conductive elements or components associated with the corresponding electrical node shown in FIG. 1. The construction, configuration, and other characteristics of the spacecraft common conductor 114 may vary. In some cases, the spacecraft common conductor 114 may include one or more circuit board traces, wires, cables, or other conductive structures (e.g., a conductive plate) that collectively terminate at the monitoring probe 114 and the frame 102, as shown. The configuration of the spacecraft common conductor 114 may vary in accordance with the manner in which the monitoring probe 104 detects the electric potential. For instance, and as described herein, the electric potential may be detected via an arrangement involving an isolation amplifier and/or one or more discrete capacitors, in which case the spacecraft common conductor 114 may be or otherwise include one or more circuit board traces. In other cases, such as when an arrangement involving a tuning fork electric field sensor and/or parasitic capacitance is used, the spacecraft common conductor 114 may be or otherwise include one or more traces in combination with a conducting plate. The composition, construction, configuration, and other characteristics of the spacecraft common conductor 114 may thus vary considerably.

The monitoring probe 104 includes a second, or isolated, conductor 116 (or "probe conductor") capacitively coupled to the spacecraft common conductor 114. The probe conductor 116 may include one or more conductive elements or components associated with the corresponding electrical node shown in FIG. 1. The construction, configuration, and other characteristics of the probe conductor 116 may vary. In some cases, the probe conductor 116 may include one or more circuit board traces, wires, cables, or other conductive structures (e.g., a conductive plate) that collectively connect to the remainder of the monitoring probe 104 as shown. The configuration of the probe conductor 116 may vary in accordance with other components of the monitoring probe 104. For instance, the probe conductor 116 may be or otherwise include a circuit board trace in arrangements involving an isolating amplifier and/or discrete capacitors to detect the electric potential. In other cases, the probe conductor 116 may be or include a conducting plate (e.g., configured to control parasitic capacitance) in arrangements involving a tuning fork electric field sensor and/or parasitic capacitance to detect the electric potential. The composition, construction, configuration, and other characteristics of the probe conductor 116 may thus vary considerably.

In the example of FIG. 1, the capacitive coupling of the conductors 114, 116 is established or provided by a capacitor 118 of the monitoring probe 104. The capacitor 118 may be or include one or more discrete capacitors connected between the conductors 114, 116. The capacitor 118 may be useful for establishing an electrostatic charging rate for the monitoring probe 104. Alternatively or additionally, the capacitive coupling of the conductors 114, 116 is established or provided by a parasitic capacitance between the conductors 114, 116. For instance, each conductor 114, 116 may include a conductive plate or other structure. The plates may be spaced from one another to establish the parasitic capacitance. The construction, configuration, capacitance, and other characteristics of the capacitor 118 (or other capacitive coupling) may vary considerably. For instance, the capacitor 118 may or may not include one or more dielectric components disposed between components of the conductors 114, 116.

The monitoring probe 104 includes a switch 120 connected to the spacecraft common conductor 114 and the probe conductor 116. Closure of the switch 120 electrically ties the spacecraft common conductor 114 and the probe conductor 116. In some cases, the switch 120 is or otherwise includes an electronic switch, such as a transistor switch. Alternatively or additionally, the switch 120 is or includes an electromechanical switch, such as a relay. Still other types of switches may be used.

In the example of FIG. 1, the switch 120 is controlled by a control signal generated by the controller 106. Alternatively or additionally, the switch 120 is controlled by another controller or other processor. For instance, the switch 120 may be configured for self-controlled, automatic functionality. In these and other cases, closure and opening of the switch may be regular (e.g., periodic) and/or triggered by an event and/or other condition(s).

The monitoring probe 104 includes a monitoring circuit 122 in electrical communication with the probe conductor 116. The monitoring circuit 122 is configured to detect an electric potential between the two conductors 114, 116. In this case, the monitoring circuit 122 is configured to detect an electric potential of the probe conductor 116 relative to the spacecraft common conductor 114. In other cases, the monitoring circuit 122 is configured to detect the electric potential of the spacecraft common conductor 114 relative to the probe conductor 116. Either way, the measurement may be inverted if the other polarity is desired. As a result, either conductor may be selected to act as a reference. A ground reference may be used in some cases, e.g., cases in which active devices, such as the transistors in an isolation amplifier, are involved.

The monitoring circuit 122 presents a blocking impedance 124 to isolate the probe conductor 116 from the spacecraft common conductor 114 while the switch 120 remains open. The manner in which the monitoring circuit 122 is connected between the spacecraft common conductor 114 and the probe conductor 116 may vary. In the example of FIG. 1, the blocking impedance 124 is or includes an isolating resistor disposed between the two conductors 114, 116 (e.g., in series with the monitoring circuit 122).

The configuration of the monitoring circuit 122 may vary. In the example of FIG. 1, the monitoring circuit 122 is or includes an isolation amplifier and/or an electric field sensor (e.g., a tuning fork electric field sensor). An isolation amplifier may be used in applications in which high speed implementation is useful. A tuning fork electric field sensor may be used in applications in which high accuracy and/or low leakage is desirable. In both cases, the isolating resistor 124 is integrated, incorporated, or otherwise included. Other types of potential or voltage measurement circuits may be used.

In some cases, the monitoring circuit 122 is configured such that the spacecraft conductor 114 provides a reference voltage to the monitoring circuit 122. Thus, for instance, the spacecraft common may be used as a ground or reference voltage for components of the monitoring circuit 122, such as an isolation amplifier. Reliance on an isolation amplifier may be useful in the sense that the isolation amplifier is capable of accepting input voltages with a large potential difference relative to the power rails. In addition, the electric potential measurement of the isolation amplifier is bipolar.

In the example of FIG. 1, the analog-to-digital circuit 112 is coupled to the monitoring circuit 122 to generate a digital signal representative of the electric potential detected by the monitoring circuit 122. In other cases, the monitoring circuit 122 may provide an analog output signal directly to the controller 106.

Some or all of the above-described components of the monitoring probe 104 may be disposed on a circuit board. For example, one or more of the spacecraft common conductor 114 (or component thereof), the probe conductor 116 (or component thereof), the capacitor 118, the switch 120, the monitoring circuit 122, and the isolation impedance 124 may be disposed on a single circuit board (or multiple circuit boards). The circuit board may be secured to the frame 102 by a mount and/or other structure. In these and other ways, the monitoring probe 104 and other aspects of the disclosed devices may be conveniently disposed within an interior of the spacecraft 100.

In operation, the switch 120 may initially reside in the open state. The probe conductor 116 is thus initially electrically isolated from the spacecraft common conductor 114. To prepare for monitoring the electric potential of the spacecraft common conductor 114, the switch 120 is closed. The probe conductor 116 is thus connected, or electrically tied, to the spacecraft common conductor 114. In doing so, the probe conductor 116 takes on the spacecraft electric potential. The monitoring probe 104 is now ready to begin monitoring.

To begin the monitoring, the probe conductor 116 is disconnected from the spacecraft common conductor 114 by opening the switch 120. The probe conductor 116 is now electrically isolated from the spacecraft common conductor 114. While the probe conductor 116 remains isolated, charge accumulates on the spacecraft common conductor 114 for various reasons (e.g., beam emission, space weather, etc.). The monitoring circuit 122 measures the potential difference, or voltage, between the probe conductor 116 and the spacecraft common conductor 114. The measured value is indicative of the change in the spacecraft potential since the opening of the switch 120.

The above-described measurement process may be repeated, e.g., rapidly repeated. The change in spacecraft potential from multiple measurements may combined to provide a cumulative change in spacecraft potential over time.

The electric potential detected by the monitoring circuit 122 is thus indicative of a change in electric potential of the spacecraft common conductor 114 relative to the probe conductor 116 since an opening of the switch 120. For instance, the monitoring circuit 122 may provide an analog output indicative of the change in electric potential. The analog output is then provided (indirectly or directly) to the controller 106. The controller 106 is thus configured to generate, based on the detected electric potential, an indication (e.g., a digital indication) of a change in electric potential of the spacecraft common conductor 114 since an opening of the switch 120.

In some cases, the change in electric potential of the spacecraft common conductor 114 is equal to the inverse of the electric potential detected by the monitoring circuit 122. For example, when spacecraft common is used as a ground or reference voltage for the monitoring circuit 122, a positive change in spacecraft common leads to an equal and opposite (i.e., negative) change in the output signal due to the isolation and, thus, unchanged potential of the probe conductor 116.

The controller 106 may be configured to store the data indicative of the change in the electric potential. For example, the data may be stored in the memory 110. The manner in which the data is stored may vary. In some cases, the data may be stored in a cumulative fashion, e.g., in combination with other data, i.e., another indication of the change in the electric potential. In this way, the controller 106 may be configured to generate, based on the detected electric potential, a composite change in electric potential of the spacecraft common conductor 114 over time, e.g., over multiple charging periods between successive instances of the opening of the switch 120.

The same or different processors may be used to control the switch 120 and process the signals provided by the monitoring circuit 122. In multiple processor cases, the processors may be integrated or otherwise included in the controller 106. In other cases, the spacecraft 100 may include multiple controllers, computers, or other processing devices dedicated to switch control and data processing.

In the example of FIG. 1, the spacecraft 100 includes a beam generator 126, such as an electron or ion beam generator. Emissions or other operation of the beam generator 126 may induce the electrostatic charging, or potential changes, of the spacecraft common conductor 114. Alternatively or additionally, the electrostatic charging arises from other events or circumstances. Either way, the data or other indication of the spacecraft potential may be provided to the beam generator 126 for control thereof. For instance, the beam generator 126 may be configured to shut down in response to data indicating an unsafe or otherwise excessive amount of electrostatic charging.

Figure 2:
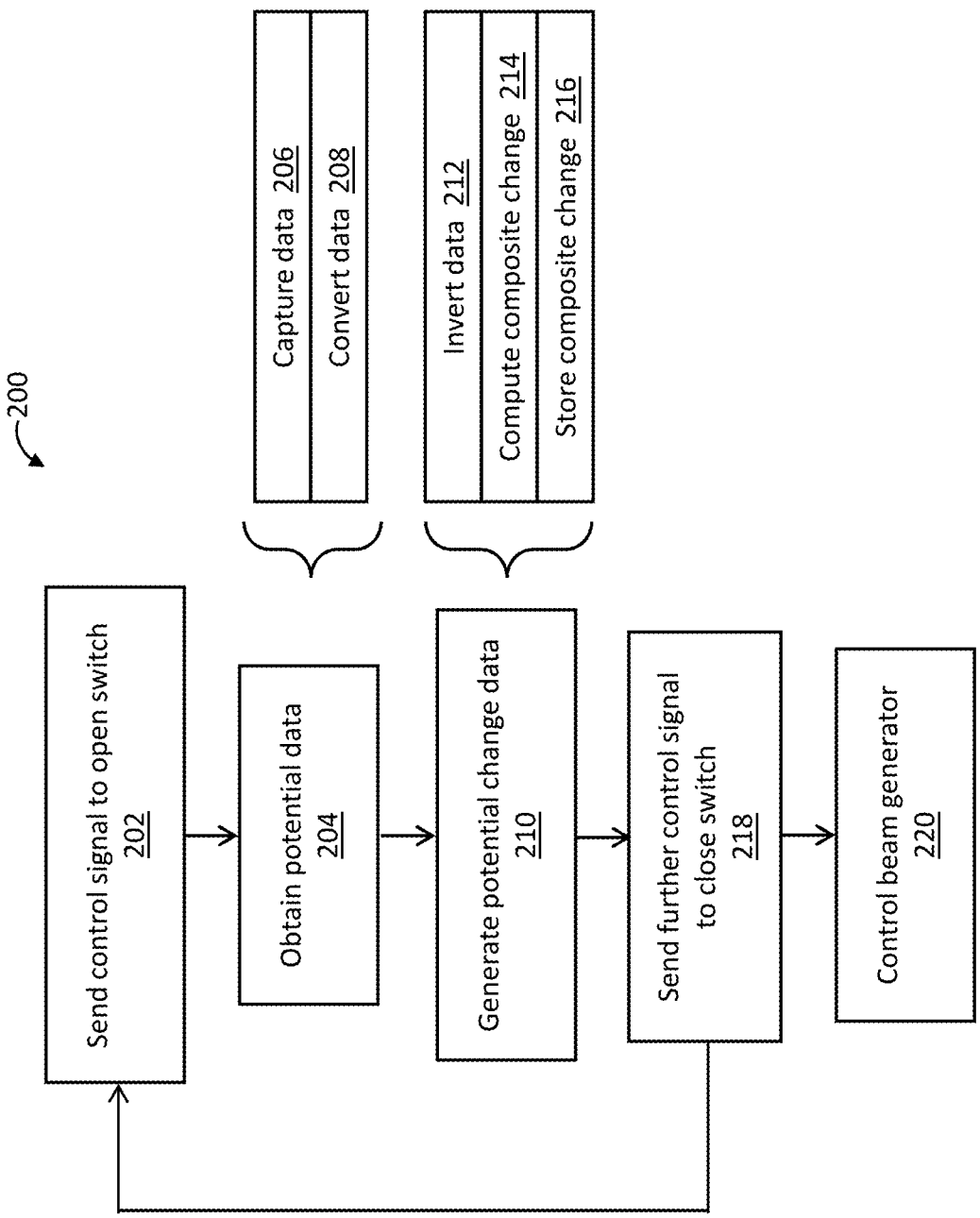
FIG. 2 is a flow diagram of a method of monitoring spacecraft electric potential, or charging, in accordance with one example.

FIG. 2 depicts a method 200 of monitoring spacecraft electric potential in accordance with one example. The method 200 may be implemented by the controller 106 (FIG. 1), the processor 108 (FIG. 1), and/or another controller or processor. The method 200 may use one of the monitoring probes or devices described herein and/or another monitoring probe or device.

The method 200 may include one or more acts directed to initializing or otherwise preparing one or more monitoring device components for operation. For instance, a switch and/or other components of the monitoring device may be put in a ready state in preparation for monitoring. For example, a switch may be closed in preparation for monitoring.

The method 200 may then include an act 202 in which a control signal is sent to the switch to open the switch. The switch is connected to two conductors, e.g., a probe conductor and a spacecraft common conductor, as described above. The spacecraft common conductor may be in electrical communication with a spacecraft frame. The probe conductor is capacitively coupled to the spacecraft common conductor.

Once the switch is opened, an indication of an electric potential of the probe conductor relative to the spacecraft common conductor is obtained in an act 204. The indication is provided via a monitoring circuit in electrical communication with the probe conductor. In some cases, the act 204 includes an act 206 in which signals or data are received or otherwise captured. The signals or data may be or include analog signals or digital data provided by the monitoring circuit. When analog signals are captured, the act 204 may additionally include converting the analog signals to digital data in an act 208.

In an act 210, data indicative of a change in electric potential since an opening of the switch is generated. The data is generated based on the obtained signals, data, or other indications. If the electric potential of the probe conductor relative to the spacecraft common conductor was obtained, then the act 210 may include an act 212 in which the data indicative of the change in electric potential is inverted.

In some cases, the act 210 includes an act 214 in which a composite change in electric potential is computed. The composite change may be computed by adding or combining the data from multiple instances of the monitoring routine.

The data indicative of the change in spacecraft common potential may be stored in an act 216. In the example of FIG. 2, the composite change is additionally or alternatively stored.

In an act 218, a further control signal is sent to the switch to close the switch to electrically tie the two conductors in preparation for further monitoring of the electric potential of, e.g., the probe conductor relative to the spacecraft common conductor. Control may then return to the act 202 for repetition of the monitoring procedure.

The method 200 may also include an act 220 in which a beam generator is controlled. The act 220 may be implemented in response to the potential change data generated in the act 210. For instance, if the potential change exceeds a threshold value, the act 220 may involve or otherwise include shutting down the beam generator or lowering an emission magnitude. Excessive or otherwise undesirable electrostatic charging of the spacecraft common may thus be avoided or prevented.

In another cases, the act 220 may be directed to controlling additional or alternative equipment. For instance, electronics may be shutoff in the event that the change in electric potential passes a threshold.

The method 200 may have additional, fewer, or alternative acts. For instance, the method 200 may not include the act 220 in which a beam generator is controlled.

The order of the acts of the method 200 may vary from the example shown. For instance, the act 220 may be implemented before the act 218, or at any other time based on previously generated potential data.

Figure 3:
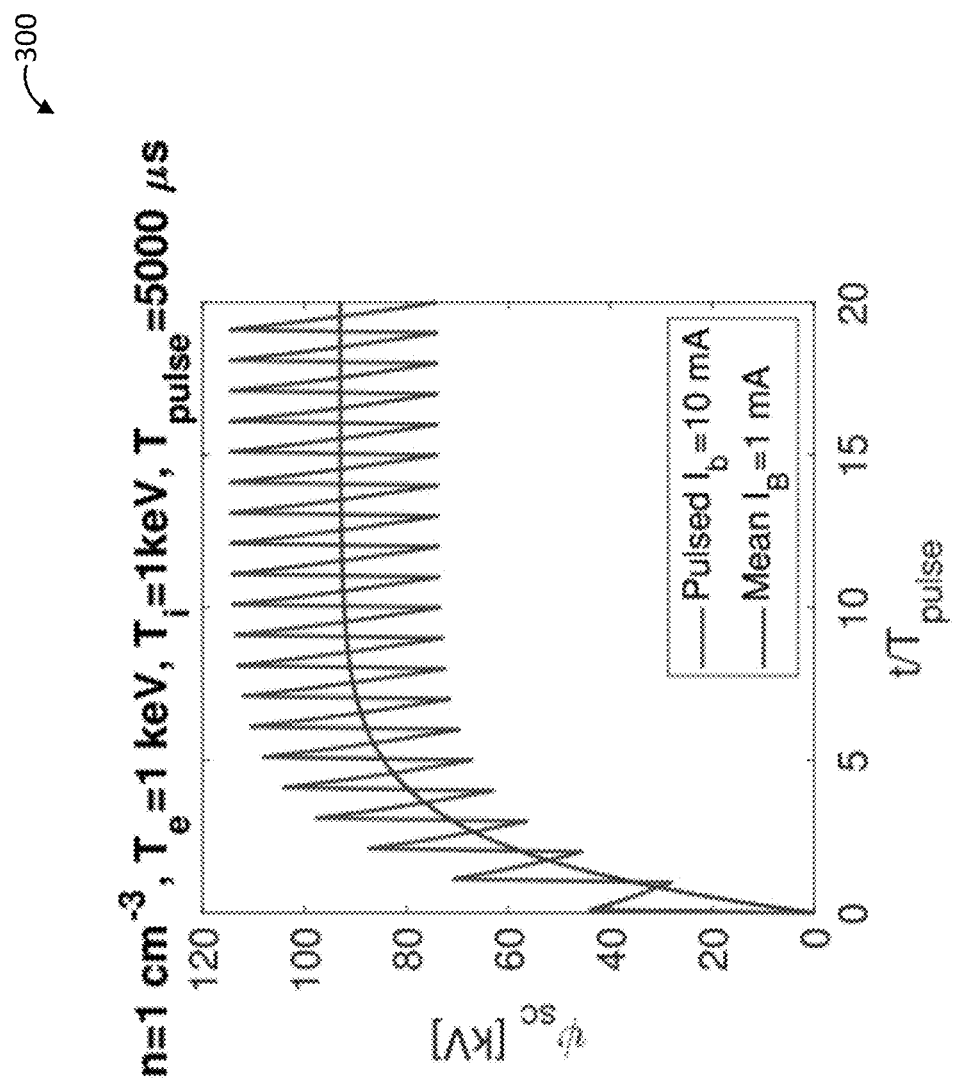
FIG. 3 is a graphical plot of spacecraft electric potential over time for a spacecraft configured for charged particle emission, such as an electron beam, and control (e.g., shutoff or shutdown) of such emission using electric potential monitoring information in accordance with one example.

FIG. 3 depicts a graphical plot 300 of spacecraft common potential over time in accordance with one example in which the disclosed devices and methods are used to control the firing of a pulsed 10 mA electron beam. The beam may be cycled on and off based on the monitoring of the electric potential. In this example, the beam ends up operating with a 10% duty cycle. The resulting electrostatic charging of the spacecraft is plotted along with the charging resulting from a 1 mA constant current electron beam. In either case, the emissions from the electron beam generators result in electrostatic charging of the spacecraft common and, thus, a positive increase in electric potential. Eventually, the high, positive potential of the spacecraft attracts the ambient electrons present in the space plasma surrounding the spacecraft. The electric potential therefore decreases as shown while the pulsed beam is shutoff.

In the example of FIG. 3, the parameter n is the ambient plasma density in particles per cubic centimeter, the parameter $T_e$ is the ambient plasma electron temperature in kilo-electronvolts, the parameter $T_i$ is the ambient plasma ion temperature in kilo-electronvolts, and the parameter $T_{pulse}$ is the beam pulse duration in microseconds, which may be used to convert the x axis of the graphical plot 300 values into microseconds.

The operation and control of the electron beam generator provides an example of the manner in which the high cadence monitoring provided by the disclosed methods and devices may be useful. For instance, the monitoring may be implemented or repeated at a rate (e.g., above 10 kiloHertz) to approximate an asymptotic peak in electric potential change. Alternatively or additionally, the monitoring may be implemented at a higher rate (e.g., above 100 kiloHertz) to support beam control (e.g., shut off).

Described above are devices and methods useful for monitoring electric potential change in spacecraft or other ungrounded vehicles or structures. The disclosed devices and methods provide a technique for monitoring with reasonable measurement accuracy (e.g., less than 1 kiloVolt of potential error). The disclosed devices and methods may be deployed or implemented in-situ, thereby avoiding costly or complex arrangements. The disclosed devices and methods may be used to support beam shut off and/or other mission control operations, including, for instance, disabling equipment in the event of excessive levels of electrostatic charging.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. A device for monitoring spacecraft electric potential, the circuit comprising:
    a first conductor configured to be in electrical communication with a conductive structure of a spacecraft;
    a second conductor capacitively coupled to the first conductor;
    a switch connected to the first conductor and the second conductor such that closure of the switch electrically ties the first conductor to the second conductor; and
    a monitoring circuit in electrical communication with the second conductor, the monitoring circuit being configured to detect an electric potential of the second conductor relative to the first conductor, the detected electric potential being indicative of a change in electric potential of the first conductor relative to the second conductor since an opening of the switch.

2. The device of claim 1, wherein:
    the conductive structure comprises a frame of the spacecraft; and
    the first conductor is configured to be electrically tied to the frame.

3. The device of claim 1, wherein the first conductor is electrically tied to spacecraft common potential such that the electric potential detected by the monitoring circuit is relative to the spacecraft common potential.

4. The device of claim 1, wherein:
    the monitoring circuit is connected between the first conductor and the second conductor; and
    the monitoring circuit is configured such that the first conductor provides a reference voltage to the monitoring circuit.

5. The device of claim 1, further comprising a controller coupled to the monitoring circuit, the controller being configured to store the indication of the change in the electric potential for combination with a further indication of the change in the electric potential to generate, based on the detected electric potential, a composite change in electric potential of the first conductor over multiple charging periods between successive instances of the opening of the switch.

6. The device of claim 5, wherein the controller is further configured to generate a control signal for the switch.

7. The device of claim 1, wherein the monitoring circuit presents a blocking impedance to isolate the second conductor from the first conductor while the switch remains open.

8. The device of claim 7, wherein the blocking impedance comprises an isolating resistor disposed between the first and second conductors.

9. The device of claim 1, wherein the monitoring circuit comprises an isolation amplifier.

10. The device of claim 1, wherein the monitoring circuit comprises an electric field sensor.

11. The device of claim 1, further comprising an analog-to-digital circuit coupled to the monitoring circuit to generate a digital signal representative of the detected electric potential.

12. A device for monitoring an electric potential of an ungrounded system, the circuit comprising:
    a first conductor configured to be in electrical communication with a conductive structure of the ungrounded system;
    a second conductor capacitively coupled to the first conductor;

a switch connected to the first conductor and the second conductor such that closure of the switch electrically ties the first conductor to the second conductor; and a monitoring circuit in electrical communication with the second conductor, the monitoring circuit being configured to detect an electric potential of the second conductor relative to the first conductor, the detected electric potential being indicative of a change in electric potential of the first conductor relative to the second conductor since an opening of the switch.

13. The device of claim 12, wherein:

the conductive structure comprises a frame; and the first conductor is configured to be electrically tied to the frame.

14. The device of claim 12, wherein the first conductor is electrically tied to a common potential such that the electric potential detected by the monitoring circuit is relative to the common potential.

15. The device of claim 12, wherein:

the monitoring circuit is connected between the first conductor and the second conductor; and the monitoring circuit is configured such that the first conductor provides a reference voltage to the monitoring circuit.

16. The device of claim 12, further comprising a controller coupled to the monitoring circuit, the controller being configured to store the indication of the change in the electric potential for combination with a further indication of the change in the electric potential to generate, based on the detected electric potential, a composite change in electric potential of the first conductor over multiple charging periods between successive instances of the opening of the switch.

17. The device of claim 16, wherein the controller is further configured to generate a control signal for the switch.

18. The device of claim 12, wherein the monitoring circuit presents a blocking impedance to isolate the second conductor from the first conductor while the switch remains open.

19. The device of claim 18, wherein the blocking impedance comprises an isolating resistor disposed between the first and second conductors.

20. The device of claim 12, wherein the monitoring circuit comprises an isolation amplifier.

21. The device of claim 12, wherein the monitoring circuit comprises an electric field sensor.

* * * * *